United States Patent [19]

Offenberg

[11] Patent Number: 5,578,755
[45] Date of Patent: Nov. 26, 1996

[54] ACCELEROMETER SENSOR OF CRYSTALLINE MATERIAL AND METHOD FOR MANUFACTURING THE SAME

[75] Inventor: Michael Offenberg, Tuebingen, Germany

[73] Assignee: Robert Bosch GmbH, Stuttgart, Germany

[21] Appl. No.: 348,700

[22] Filed: Dec. 2, 1994

[30] Foreign Application Priority Data

Dec. 3, 1993 [DE] Germany .......................... 43 41 271.8

[51] Int. Cl.⁶ .................................................. G01P 15/125
[52] U.S. Cl. ........................................................ 73/514.32
[58] Field of Search ........................... 73/514.32, 514.36, 73/514.38, 514.21, 514.24; 361/280, 283.1

[56] References Cited

U.S. PATENT DOCUMENTS

| | | | |
|---|---|---|---|
| 4,663,972 | 5/1987 | Gérard | 73/517 R |
| 4,711,128 | 12/1987 | Boura | 73/517 B |
| 5,233,213 | 8/1993 | Marek | 73/514.32 |
| 5,345,824 | 9/1994 | Sherman et al. | 73/514.32 |
| 5,417,111 | 5/1995 | Sherman et al. | 73/514.32 |
| 5,447,067 | 9/1995 | Biebl et al. | 73/514.32 |
| 5,447,068 | 9/1995 | Tang | 73/514.32 |

FOREIGN PATENT DOCUMENTS

WO92/03740 3/1992 WIPO ............................. G01S/125

*Primary Examiner*—John E. Chapman
*Attorney, Agent, or Firm*—Kenyon & Kenyon

[57] ABSTRACT

In an accelerometer sensor of crystalline material, whose components are composed partly of monocrystalline and partly of polycrystalline material, a band-shaped seismic mass preferably is composed of polycrystalline material, whose suspension by means of suspension segments of monocrystalline material at the end regions permits a movement in the longitudinal direction upon the occurrence of an acceleration. Parallel plates extend from this mass at right angles to their longitudinal direction and, together with additional plates, which run parallel to said plates and are anchored at a base, form a capacitor arrangement and are composed, in particular, of monocrystalline material. At least the monocrystalline material is doped to attain an electric conductivity. When lightly doped, the long and thin plates and suspension segments have a high conductivity, given a very small mechanical prestressing, and can easily be isotropically undercut. The polycrystalline formation of the seismic mass can be designed to be very wide and large by etching away an underlying sacrificial oxide.

7 Claims, 3 Drawing Sheets

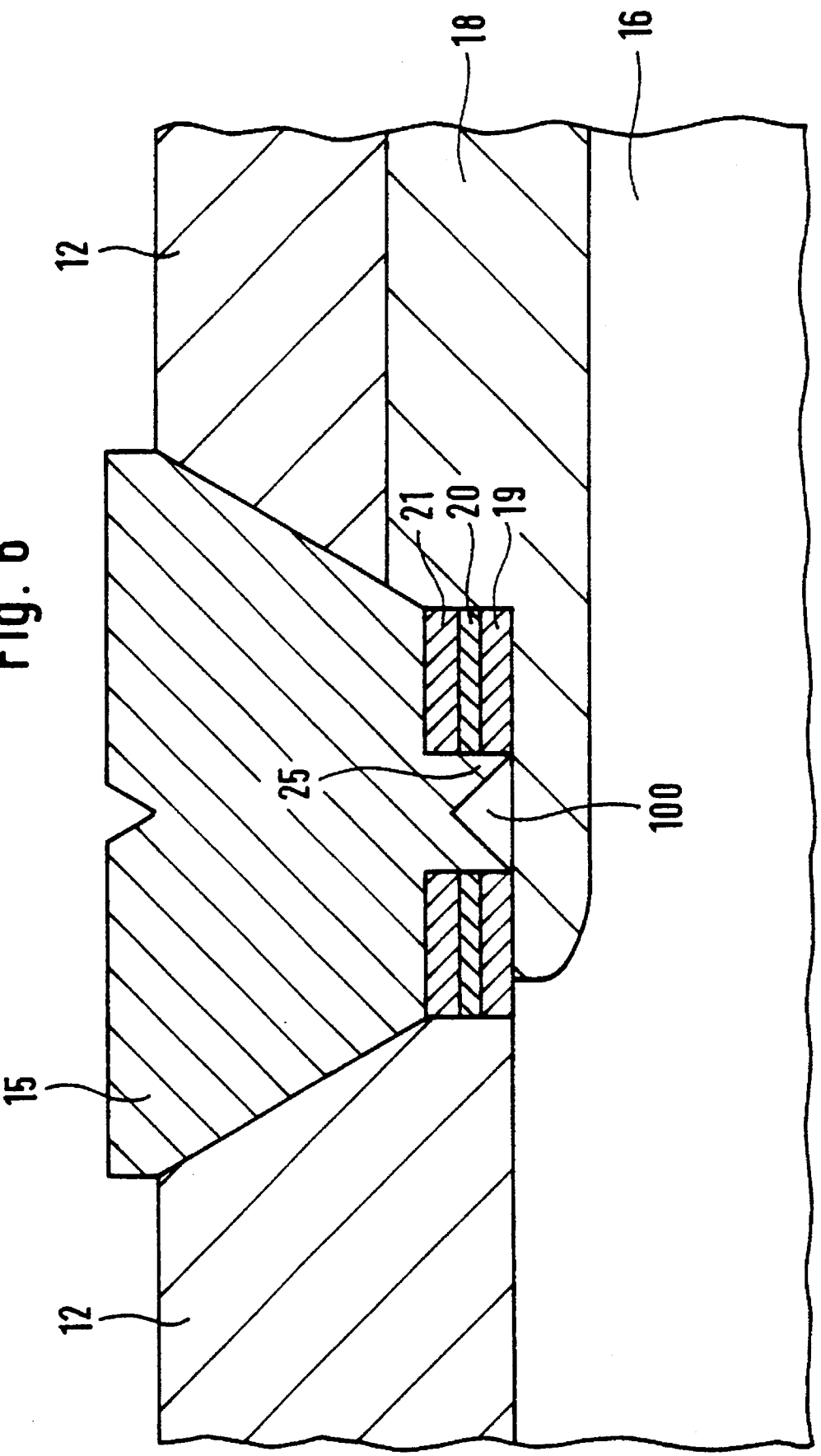

ACCELEROMETER SENSOR OF CRYSTALLINE MATERIAL AND METHOD FOR MANUFACTURING THE SAME

FIELD OF THE INVENTION

The present invention relates to an accelerometer sensor of crystalline material and to a method for manufacturing such an accelerometer sensor.

BACKGROUND OF THE INVENTION

U.S. Pat. Nos. 4,711,128 and 4,663,972 describe a resiliently suspended seismic mass and plates disposed to fit into one another to form a capacitor or rather a capacitive accelerometer sensor which are made of monocrystalline material, in particular of quartz or of monocrystalline silicon. To manufacture this type of structure, trenches are initially produced in an epitaxy in the customary fashion by means of an anisotropic etching, and the so formed structures are then dissolved from the substrate by means of isotropic undercutting.

The disadvantage of this arrangement is that during the isotropic undercutting, the material is removed from both sides, essentially in a semicylindrical form, as shown in FIG. 2. This means that when a plate of a defined width is undercut, the height of the etch-out essentially corresponds to this width. The result is that when an epitaxy has a minimal height of, for example, 10 μm, it is only possible to undercut very narrow structures. It is, therefore, difficult to produce a large enough seismic mass, given this width limitation. A further disadvantage lies in that in the case of a realization in monocrystalline silicon, the contacting and the passivation of the required sensor supply leads are problematic.

PCT Patent Publication No. WO 92/03740 describes an accelerometer sensor produced using means of surface micromechanics, in which the capacitor structures and the suspension segments, in particular, consist of polycrystalline silicon.

The disadvantage of a polycrystalline material lies in the restricted activating capacity of dopants. Especially in the case of sensors in the low-acceleration range, the suspension segments for the seismic mass must have a very long and thin design. However, to achieve high conductivity, a high level of doping is required. The component of dopant material, which is introduced into the grain boundaries of the polycrystalline material and, which consequently, is not electrically activated, can contribute to an increased compressive stress and, given a concentration gradient, also to a voltage gradient. Laying bare the structures causes the suspension segments that are held on two sides to be raised and the capacitor plates that are retained on one side to be curved. Both effects limit the maximum attainable size and conductance of the structure. Moreover, the linear deformation and the compressive stress in the suspension segments can cause the seismic mass to assume various preferred states which is undesirable and adversely affects free mobility.

SUMMARY OF THE INVENTION

The accelerometer sensor according to the present invention has the advantage that by combining monocrystalline and polycrystalline material in accordance with the present invention, the above-named disadvantages no longer occur. When polycrystalline material is preferably used for the seismic mass, it can have a very wide and, thus, very large design. The step of laying bare can take place by means of a selective sacrificial-layer etching. On the other hand, long and thin structures, such as the parallel plates of the capacitor arrangement and the suspension segments, where the conductance must be at a maximum and the strain at a minimum, are advantageously produced in monocrystalline material. In the case of such narrow, plate-like structures, the isotropic undercutting does not constitute a disadvantage. High conductances can be achieved with little doping. A simple contacting of the sensor can follow within the scope of a standard IC process, with passivation of the supply leads.

The crystalline material is preferably silicon, the base consisting of monocrystalline silicon.

The suspension segments run expediently at right angles to the longitudinal direction of the seismic mass and are anchored at their unattached ends to the base or to an epitaxy applied to this base.

The parallel plates and/or the suspension segments each have anisotropically etched side surfaces and an isotropically etched bottom side.

The additional parallel plates, which are not connected to the seismic mass, are anchored at their end that is distant from the seismic mass, only the anchoring regions consisting of polycrystalline material. It is, thus, possible for a retention region that is protected all around by sacrificial oxide during the isotropic etching to remain.

The seismic mass and/or the anchoring regions each have anisotropically etched side surfaces and a bottom side formed by sacrificial oxide etching. By applying the sacrificial oxide, the seismic mass can be made as large as needed.

The accelerometer sensor advantageously has, in addition, at least one integrated circuit on the epitaxy next to the sensor region, so that the sensor and the evaluation circuit are able to be produced on one component part. The structure according to the present invention renders possible a cost-effective integration of the electronic evaluation circuit.

BRIEF DESCRIPTION OF THE DRAWINGS

FIG. 6 shows an enlarged representation of the middle region of FIG. 3.

DETAILED DESCRIPTION

Figure 1:
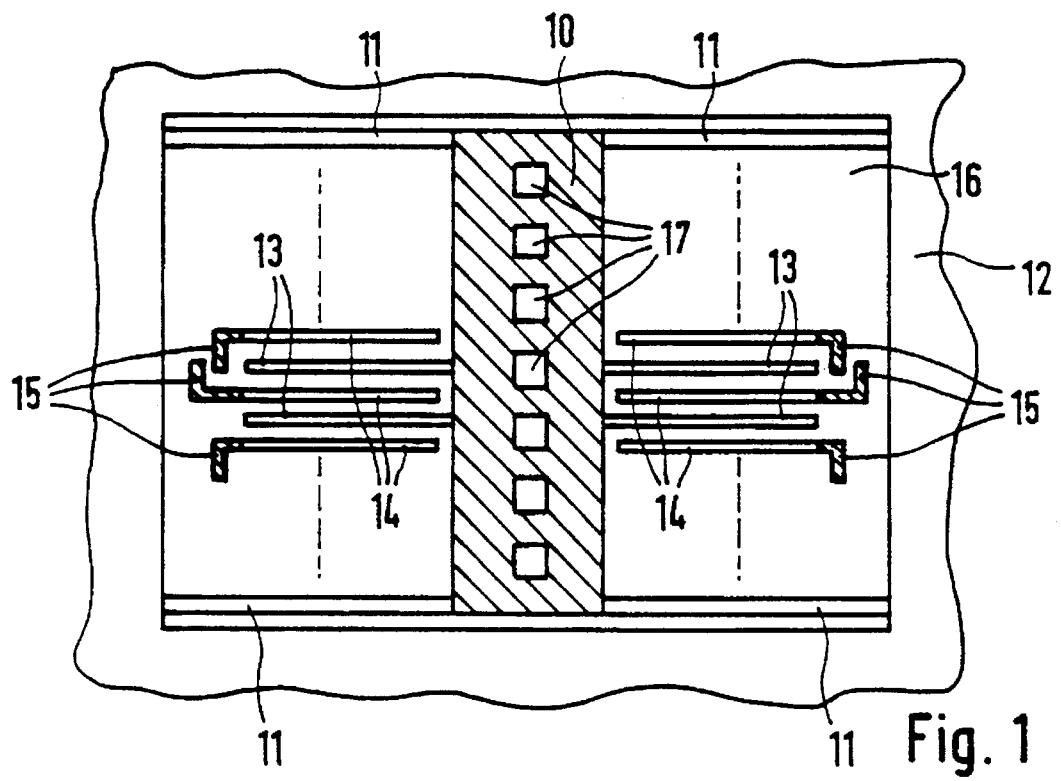
FIG. 1 shows a top view of an accelerometer sensor in an exemplary embodiment of the present invention.

The accelerometer sensor depicted in a top view in FIG. 1 includes a band-shaped seismic mass 10 of polycrystalline silicon. Running at both of its ends, in each case perpendicularly to the longitudinal direction toward both sides, are thin suspension segments 11 of monocrystalline silicon, which are connected in one piece to the epitaxy 12 of monocrystalline silicon surrounding the sensor region. As a result, when corresponding accelerations occur, the seismic mass 10 can move in its longitudinal direction relative to the epitaxy 12.

Thin, elongated plates 13 designed as capacitor plates are attached at both longitudinal sides of the seismic mass 10 perpendicularly to the longitudinal direction of the seismic mass 10. They consist of a monocrystalline material. Running between these parallel plates 13, fitting into one another in each case in the manner of fingers, are additional plates 14, which are designed as capacitor plates and are joined at their end facing away from the seismic mass 10, via anchoring regions 15 to the underlying base 16. The plates 13, 14 are thus designed as bars that are fixed on one side. The plates 13, on the one hand, and the plates 14, on the other hand, are electrically connected, in each case, among themselves, and are electrically connected from below (not shown in greater detail), and form a capacitor arrangement, whose capacitance changes in the case of a longitudinal displacement of the seismic mass 10, so that the acceleration can be detected by this means as a function of the changing capacitance.

The plates 13, 14 are made of monocrystalline silicon, while the anchoring regions 15 consist of polycrystalline silicon. The dotted line is supposed to show a simplified version of additional plates 13, 14 in a parallel arrangement.

Rectangular cut-outs 17 in the seismic mass 10 serve to simplify the etching process.

Contrary to conventional surface micromechanics, no LPCVD (low-pressure chemical vapor deposition) reactor is used for the deposition process to manufacture this accelerometer sensor, instead an epitaxial reactor is used. The process is clarified in the following on the basis of FIGS. 2 and 3.

The requisite sensor supply leads 18, for which a buried layer is used as exists in the IC process, is introduced to the plate-shaped base 16. A thin thermal oxide 19 (50 nm) is then initially allowed to grow over the entire surface. Over that, an insulating, hydrofluoric-acid-resistant layer 20 is deposited. This can be, for example, a 140 nm thick nitride layer. The actual sacrificial oxide layer 21 is then applied to that, which can be, for example, a 1.2 μm thick LTO (low temperature oxide) layer. A starting layer (not shown in greater detail) of LPCVD polysilicon is then deposited on to that. It is this starting layer that first ensures a continuous growth of poly/monocrystalline in the changeover region in the subsequent epitaxial step. The conductivity of this layer can be increased by means of an implantation.

At this point, the described layer packet is subsequently removed through the application of a photo-step and a series of etching processes everywhere that monocrystalline material is supposed to grow. Thus, these layers only remain in the area of the seismic mass 10 and of the anchoring regions 15. Moreover, certain areas of this layer packet should still remain, so as to allow reception of an end point signal during the subsequent anisotropic etching of the trenches, as will be clarified later on. These areas can remain, for example, at unimportant edge areas of the wafer.

A treatment in the epitaxial reactor now follows, in which a monocrystalline layer of, for example, 11 μm thickness grows (epitaxy 12) on the uncovered regions that are freed of the layer packet, while a polycrystalline layer of more or less the same thickness grows on the starting layer, i.e., on the remaining regions of the layer packet 19–21. During the process of growing this layer, a monocrystalline cone 100 is produced, which emanates from the base 16 and is then rigidly joined to the anchoring segment ridge 25. FIG. 6 illustrates the condition following the treatment in the epitaxial reactor.

Figure 4:
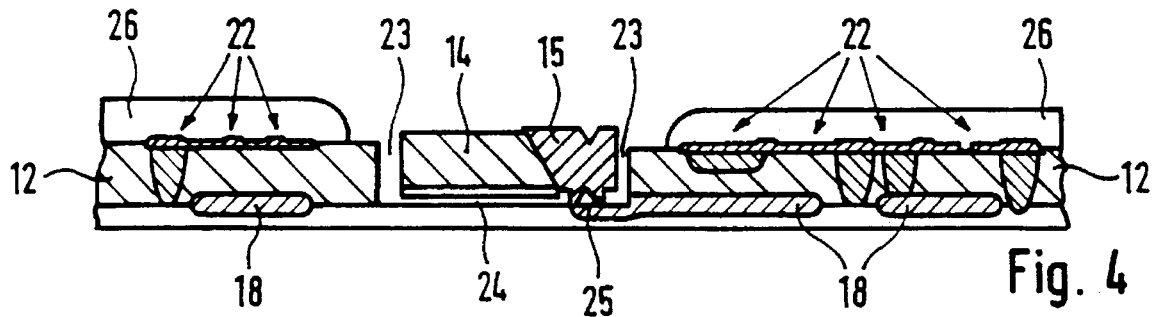

At this point, with the aid of a standard process, an evaluation circuit 22 is completely processed in the monocrystalline region, and thus, on the monocrystalline epitaxy 12. This is schematically shown in FIG. 4.

After a covering operation in which an appropriate resist mask is used, anisotropic trenches 23 are etched in the sensor region, to obtain the structure shown in FIG. 1. The depth of these trenches essentially corresponds to the thickness of the polycrystalline layer. The moment when the floor line rises because the sacrificial oxide is reached is selected as the instant for ending the etching process.

Figure 5:
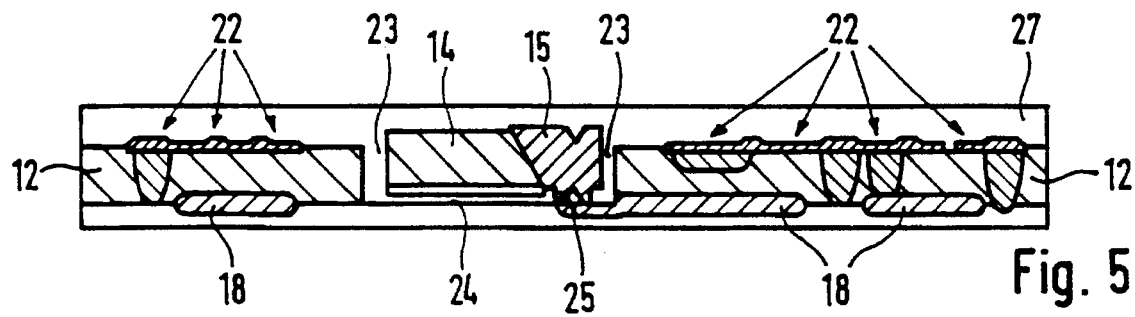

Those areas of the layer packet which remain are used for this purpose, for example, at unimportant edge areas. Two trenches 23 are schematically depicted in FIG. 4 and 5. The formed perpendicular side walls are then passivated, either by means of an oxide or an in-situ deposited polymer as described in German Patent Application No. DE 43 17 623. After the passivation is removed on the trench bottom, the monocrystalline plates 13, 14 and suspension segments 11 are isotropically undercut and laid bare. When this is done, the polycrystalline regions of the sensor are protected by the sacrificial oxide layer 21 prior to the undercutting. The isotropic undercutting must be continued until the monocrystalline regions become completely dissolved from the substrate at their end faces as well as at the junction to the polycrystalline region. Any possible overetching that occurs during the preceding anisotropic etching can be compensated for by varying the length of the etching step. An isotropically undercut region 24 is clearly shown in FIG. 2.

The polycrystalline regions are also subsequently laid bare as the result of a sacrificial oxide etching. In doing this, the regions of the sensor supply leads 18 are passivated by the double layer 19, 20. Without this passivation, open p-n junctions at the surface of the substrate would lead to strong leakage currents. While the seismic mass 10 is completely undercut, the sacrificial oxide layer 21 arranged around a polycrystalline anchoring segment 25 is removed from under the anchoring regions 15, so that this anchoring segment 15 is initially protected by the sacrificial oxide during the isotropic undercutting of the monocrystalline regions and remains when the sacrificial oxide is etched away. The state attained at this point is illustrated in FIG. 4.

During the etching process, the evaluation circuit 22 is protected by a protective layer 26, for example, a protective resist. This is removed after the etching process, and the entire accelerometer sensor is completely coated by a protective resist 27, which forms a protection when the substrate is diced into individual accelerometer sensors. Such a protection can also be achieved through other measures, for example by encapsulating the sensor region.

Figure 2:
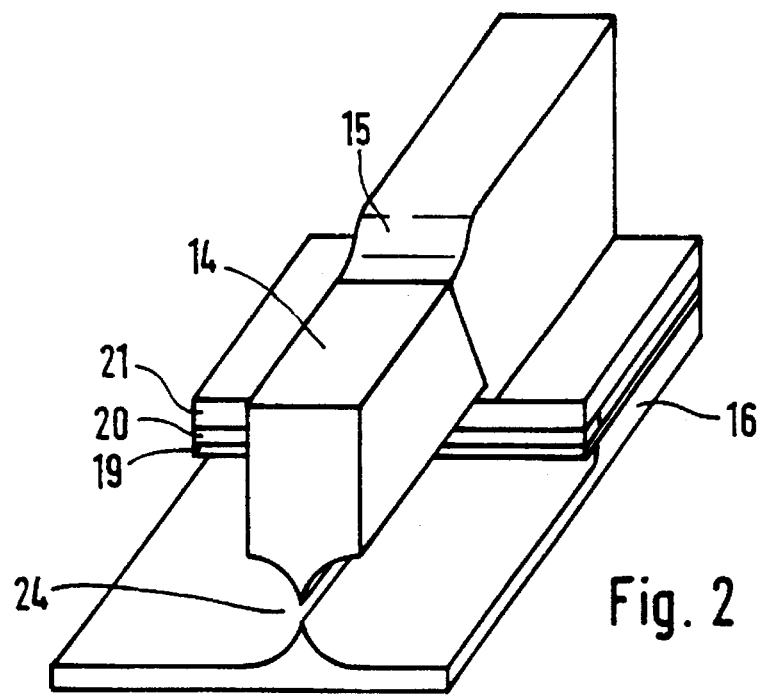
FIG. 2 shows a perspective representation of the retention region of a plate of the capacitor arrangement anchored at the base.
Figure 3:
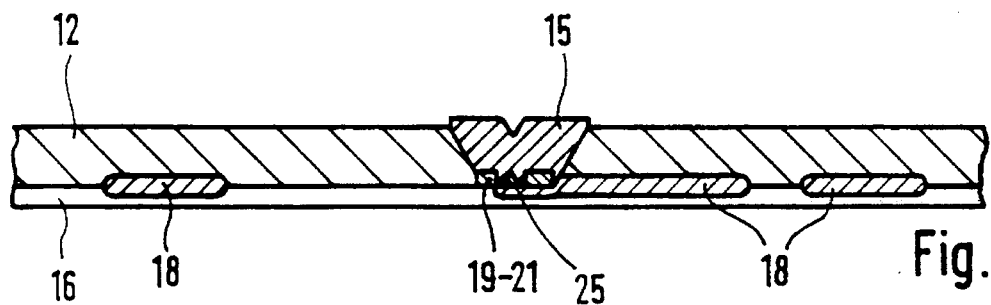
FIGS. 3 through 5 show the accelerometer sensor according to the present invention in a vertical section in various manufacturing stages, only the anchoring region of one plate at the base being shown from the sensor region for the sake of simplification.

As explained above, FIG. 2 shows a partial view of the anchoring region 15 for a plate 14 in a state in which the isotropic undercutting has already taken place, but the sacrificial oxide layer 21 has not yet been etched away. FIG. 2 could also represent the junction between the polycrystalline mass 10 and a monocrystalline plate 14 attached to it. Also, in FIGS. 3 through 5, only one anchoring region 15 and one plate 14 are depicted illustratively, to clarify the etching processes.

The doping processes needed to achieve the electric conductivity required of the seismic mass 10, the suspension segments 11, and of the plates 13, 14 are carried out in a generally known way during the manufacturing process.

What is claimed is:

1. An accelerometer sensor composed of crystalline material, comprising:

a seismic mass, suspended by suspension segments, permitting a movement in a first direction in response to an acceleration;

a plurality of parallel plates extending from the seismic mass at right angles to the first direction;

a plurality of additional plates coupled on a first end to a base, the additional plates being parallel to the parallel plates, and forming a capacitor arrangement with the parallel plates;

wherein the seismic mass is composed of polycrystalline material, the parallel plates and the suspension segments are composed of monocrystalline material, and the monocrystalline material and polycrystalline material being doped to attain an electric conductivity.

2. The accelerometer sensor according to claim 1, wherein each one of the monocrystalline material and the polycrystalline material includes silicon.

3. The accelerometer sensor according to claim 1, wherein the base is composed of monocrystalline silicon.

4. The accelerometer sensor according to claim 1, wherein each of the suspension segments includes an unattached end, wherein each of the suspension segments extends at right angles to the first direction of the seismic mass, and wherein each of the suspension segments is coupled at its unattached end to the base or an epitaxy applied to the base.

5. The accelerometer sensor according to claim 1, wherein the additional plates are coupled to the base in coupling regions only at the first end that is distant from the seismic mass, the coupling regions being composed of polycrystalline material.

6. The accelerometer sensor according to claim 1, wherein the plurality of parallel plates coupled to the seismic mass and the plurality of additional plates coupled to the base are interleaved.

7. The accelerometer according to claim 1, wherein the parallel plates and the suspension segments are formed from an epitaxy layer of monocrystalline material, and further comprising at least one integrated circuit disposed on the epitaxy layer.

* * * * *